United States Patent
Sharma et al.

(10) Patent No.: US 7,457,153 B1
(45) Date of Patent: **\*Nov. 25, 2008**

(54) INTEGRATED CIRCUIT MEMORY DEVICES HAVING MAGNETIC MEMORY CELLS THEREIN THAT UTILIZE DUAL-FERROMAGNETIC DATA LAYERS

(75) Inventors: Manish Sharma, Sunnyvale, CA (US); Lung Tran, Saratoga, CA (US)

(73) Assignee: Samsung Electronics Co., Ltd. (KR)

( \* ) Notice: Subject to any disclaimer, the term of this patent is extended or adjusted under 35 U.S.C. 154(b) by 165 days.

This patent is subject to a terminal disclaimer.

(21) Appl. No.: 11/286,009

(22) Filed: Nov. 23, 2005

(51) Int. Cl.
*G11C 7/00* (2006.01)
(52) U.S. Cl. ..................... 365/173; 365/158
(58) Field of Classification Search ................. 365/173, 365/158
See application file for complete search history.

(56) References Cited

U.S. PATENT DOCUMENTS

| | | | |
|---|---|---|---|
| 6,576,969 B2 | 6/2003 | Tran et al. | |
| 6,750,491 B2 | 6/2004 | Sharma et al. | |
| 6,803,274 B2 | 10/2004 | Sharma et al. | |
| 6,891,212 B2 | 5/2005 | Sharma et al. | |
| 6,891,746 B2 | 5/2005 | Tran et al. | |
| 6,903,403 B2 | 6/2005 | Sharma et al. | |
| 6,924,539 B2 | 8/2005 | Sharma et al. | |
| 6,936,903 B2 | 8/2005 | Anthony et al. | |
| 6,956,271 B2 | 10/2005 | Sharma | |
| 6,980,466 B2 | 12/2005 | Perner et al. | |
| 6,989,975 B2 | 1/2006 | Nickel et al. | |
| 7,027,320 B2 | 4/2006 | Sharma | |
| 7,167,391 B2 | 1/2007 | Sharma et al. | |
| 7,195,927 B2 * | 3/2007 | Sharma et al. ................. | 438/3 |
| 2004/0184311 A1 * | 9/2004 | Sharma ...................... | 365/158 |
| 2005/0169034 A1 * | 8/2005 | Perner ........................ | 365/100 |
| 2005/0213375 A1 * | 9/2005 | Perner et al. ................ | 365/158 |
| 2006/0023494 A1 * | 2/2006 | Jeong et al. ................. | 365/158 |
| 2006/0028862 A1 * | 2/2006 | Min et al. ................... | 365/158 |
| 2006/0042938 A1 * | 3/2006 | Cheng et al. ........... | 204/298.13 |
| 2006/0083054 A1 * | 4/2006 | Jeong ......................... | 365/158 |
| 2006/0087880 A1 * | 4/2006 | Mancoff et al. ............. | 365/158 |
| 2006/0098354 A1 * | 5/2006 | Parkin ..................... | 360/324.2 |
| 2006/0239064 A1 * | 10/2006 | Liaw .......................... | 365/158 |
| 2007/0097730 A1 * | 5/2007 | Chen et al. .................. | 365/158 |
| 2007/0115718 A1 * | 5/2007 | Sharma et al. .............. | 365/171 |

OTHER PUBLICATIONS

U.S. Appl. No. 11/286,245, filed Nov. 23, 2005, Sharma et al.

\* cited by examiner

*Primary Examiner*—Michael T Tran
(74) *Attorney, Agent, or Firm*—Myers Bigel Sibley & Sajovec, P.A.

(57) ABSTRACT

An exemplary memory array including a plurality of memory cells, each of the memory cells comprises a first ferromagnetic layer, a second ferromagnetic layer spaced apart from the first ferromagnetic layer by a non-magnetic insulating layer and being magnetically coupled to the first ferromagnetic layer by demagnetizing fields from the first ferromagnetic layer, a spacer layer above the second ferromagnetic layer, and a reference layer above the spacer layer. The first ferromagnetic layer, non-magnetic insulating layer, and second ferromagnetic layer in combination function as a data layer of the memory cell.

19 Claims, 10 Drawing Sheets

M1 = moment of first ferromagnetic layer
m2 = moment of second ferromagnetic layer

INTEGRATED CIRCUIT MEMORY DEVICES HAVING MAGNETIC MEMORY CELLS THEREIN THAT UTILIZE DUAL-FERROMAGNETIC DATA LAYERS

BACKGROUND

A memory chip generally comprises a plurality of memory cells that are deposited onto a silicon wafer and addressable via an array of column conducting leads (bit lines) and row conducting leads (word lines). Typically, a memory cell is situated at the intersection of a bit line and a word line. The memory cells are controlled by specialized circuits that perform functions such as identifying rows and columns from which data are read or to which data are written. Typically, each memory cell stores data in the form of a "1" or a "0," representing a bit of data.

An array of magnetic memory cells can be referred to as a magnetic random access memory or MRAM. MRAM is generally nonvolatile memory (i.e., a solid state chip that retains data when power is turned off). At least one type of magnetic memory cell includes a data layer and a reference layer, separated from each other by at least one intermediate layer. The data layer may also be referred to as a bit layer, a storage layer, or a sense layer. The reference layer may also be referred to as a pinned layer. In a magnetic memory cell, a bit of data (e.g., a "1" or "0") may be stored by "writing" into the data layer via one or more conducting leads (e.g., a bit line and a word line). The write operation is typically accomplished via a write current that sets the orientation of the magnetic moment in the data layer to a predetermined direction.

Once written, the stored bit of data may be read by providing a read current through one or more conducting leads (e.g., a read line) to the magnetic memory cell. For each memory cell, the orientations of the magnetic moments of the data layer and the reference layer are either parallel (in the same direction) or anti-parallel (in different directions) to each other. The degree of parallelism affects the resistance of the cell, and this resistance can be determined by sensing (e.g., via a sense amplifier) an output current or voltage produced by the memory cell in response to the read current.

More specifically, if the magnetic moments are parallel, the resistance determined based on the output current is of a first relative value (e.g., relatively low). If the magnetic moments are anti-parallel, the resistance determined is of a second relative value (e.g., relatively high). The relative values of the two states (i.e., parallel and anti-parallel) are typically different enough to be sensed distinctly. A "1" or a "0" may be assigned to the respective relative resistance values depending on design specification. The sensed current is inversely proportional to the resistance of the magnetic memory cell. Thus, $I_s=V/R$ (when magnetic moments are parallel) or $I_s=V/(R+\Delta R)$ (when magnetic moments are anti-parallel), where V is the applied voltage, $I_s$ is the sensed current, R is the nominal resistance of the magnetic memory cell, and $\Delta R$ is the change in resistance.

The intermediate layer, which may also be referred to as a spacer layer, may comprise insulating material (e.g., dielectric), non-magnetic conducting material, and/or other known materials, and is usually thick enough to prevent exchange coupling between the data and reference layers. The various conducting leads which are used to address the memory cells (e.g., bit lines, word lines, and read lines), and to provide currents to pass through the data and reference layers to read data from or write data to the memory cells are provided by one or more additional layers, called conducting layer(s).

Throughout this application, various exemplary embodiments will be described in reference to the TMR memory cells as first described above. Those skilled in the art will readily appreciate that the exemplary embodiments may also be implemented with other types of magnetic memory cells (e.g., other types of TMR memory cells, GMR memory cells, AMR memory cells, CMR memory cells, etc.) according to the requirements of a particular implementation.

Figure 1:
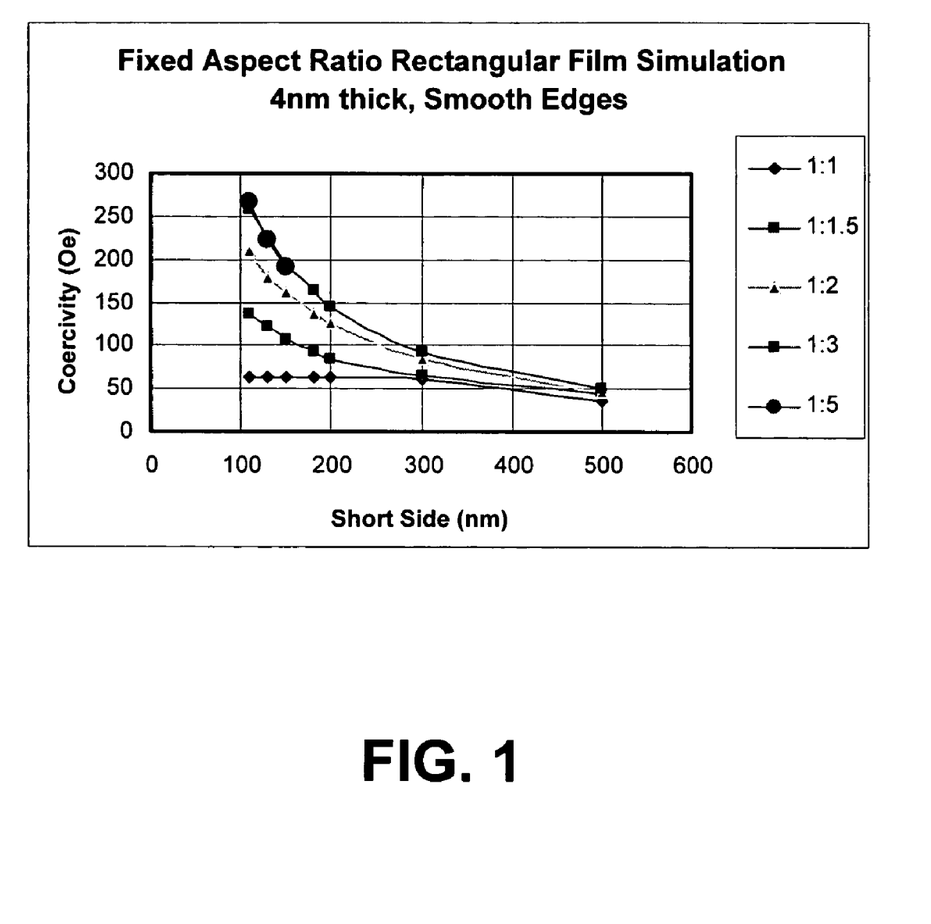
FIG. 1 illustrates an exemplary representation of some relationships between lateral dimensions of a ferromagnetic layer and changes in its coercivities.
Figure 2:
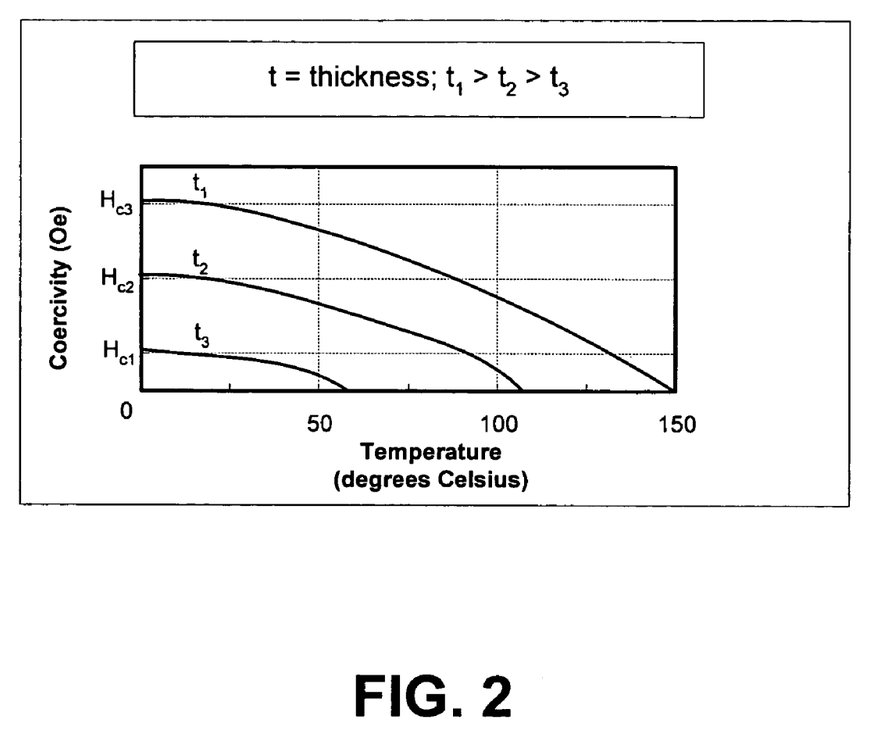
FIG. 2 illustrates exemplary representation of some relationships between the temperatures applied to a ferromagnetic layer having different thicknesses and changes in its coercivities.

Generally speaking, desirable characteristics for any configuration of memory device include increased speed, reduced power consumption, and/or lower cost. A simpler fabrication process and/or a smaller chip size may achieve lower cost. However, as magnetic memory cells become smaller, typically, higher operating current is required for achieving "write" operations. FIG. 1 illustrates some exemplary relationships between various aspect ratios (at a fixed thickness) of a ferromagnetic layer versus their coercivities. As shown in FIG. 1, magnetic coercivity increases as memory cell area decreases. As a result, an increased write current is generally needed to reverse the magnetic orientations of one or more layers of the memory cell. Higher operating current is undesirable because it goes hand-in-hand with higher power requirements, increased concern about electromigration, increased write circuitry area, and increased cost. One way to reduce the coercivity in a small magnetic memory cell is to reduce the thicknesses of the ferromagnetic layers. However, as the total magnetic volume decreases, the magnetic memory cell also becomes less thermally stable. FIG. 2 illustrates some exemplary relationships between temperature and the coercivities of ferromagnetic layers at various thicknesses (at a fixed lateral area).

In addition, as magnetic memory cells become smaller, fringe (or demagnetizing) magnetic fields produced at the edges of the reference layer may unacceptably affect nearby data layers during read/write operations. The fringe magnetic fields can influence the switching characteristics of the memory cell. Typically, the data layer has an inherent resistance (i.e., based on the data layer's material and thickness) that is overcome when attempting to change the magnetic orientation of the data layer (e.g., during a write operation). The inherent resistance, or coercivity, can be affected by other magnetic fields present near the data layer, such as the fringe magnetic fields emanating from the edges of the reference layer. As a result, data stored in the data layer may be corrupted. One way to reduce fringe magnetic fields is to have a different sized reference layer relative to the data layer. For example, the reference layer may be larger or smaller (i.e., in either or both vertical and horizontal dimensions) relative to the data layer. However, making different sized reference and data layers may introduce more complexity and cost (i.e., additional patterning steps) into the fabrication process.

Thus, a market exists for a multi-layered magnetic memory structure that has improved thermal stability as well as reduced coercivity.

SUMMARY

An exemplary memory array including a plurality of memory cells, each of the memory cells comprises a first ferromagnetic layer, a second ferromagnetic layer spaced apart from the first ferromagnetic layer by a non-magnetic insulating layer and being magnetically coupled to the first ferromagnetic layer by demagnetizing fields from the first ferromagnetic layer, a spacer layer above the second ferromagnetic layer, and a reference layer above the spacer layer.

The first ferromagnetic layer, non-magnetic insulating layer, and second ferromagnetic layer in combination function as a data layer of the memory cell.

A method for reading a multi-layered magnetic memory structure having a first ferromagnetic layer and a second ferromagnetic layer separated by a non-magnetic insulating layer (which layers in combination form a data layer of the structure) comprises providing a read current across the second ferromagnetic layer, a tunnel barrier layer, and a reference layer, sensing a resistance between the second ferromagnetic layer and the reference layer, determining a magnetic orientation of the second ferromagnetic layer based on the resistance, and determining a magnetic orientation of the first ferromagnetic layer based on the magnetic orientation of the second ferromagnetic layer.

An exemplary method for writing data into a multi-layered magnetic memory structure comprises providing a first magnetic field to reverse a magnetic moment of a first ferromagnetic layer and providing a second magnetic field less than the first magnetic field to reverse a magnetic moment of a second ferromagnetic layer without reversing the magnetic moment of the first ferromagnetic layer. The first ferromagnetic layer is separated from the second ferromagnetic layer by a non-magnetic insulating layer and has a first coercivity higher than a second coercivity of the second ferromagnetic layer.

Other embodiments and implementations are also described below.

DETAILED DESCRIPTION

I. Overview

Exemplary multi-layered magnetic memory structures and exemplary read and write operations for operating the structures are described herein.

Section II describes an exemplary multi-layered magnetic memory structure.

Section III describes an exemplary read operation.

Section IV describes an exemplary write operation.

Section V describes an exemplary process for making the exemplary multi-layered magnetic memory structure.

II. An Exemplary Multi-Layered Magnetic Memory Structure Configuration

Figure 3:
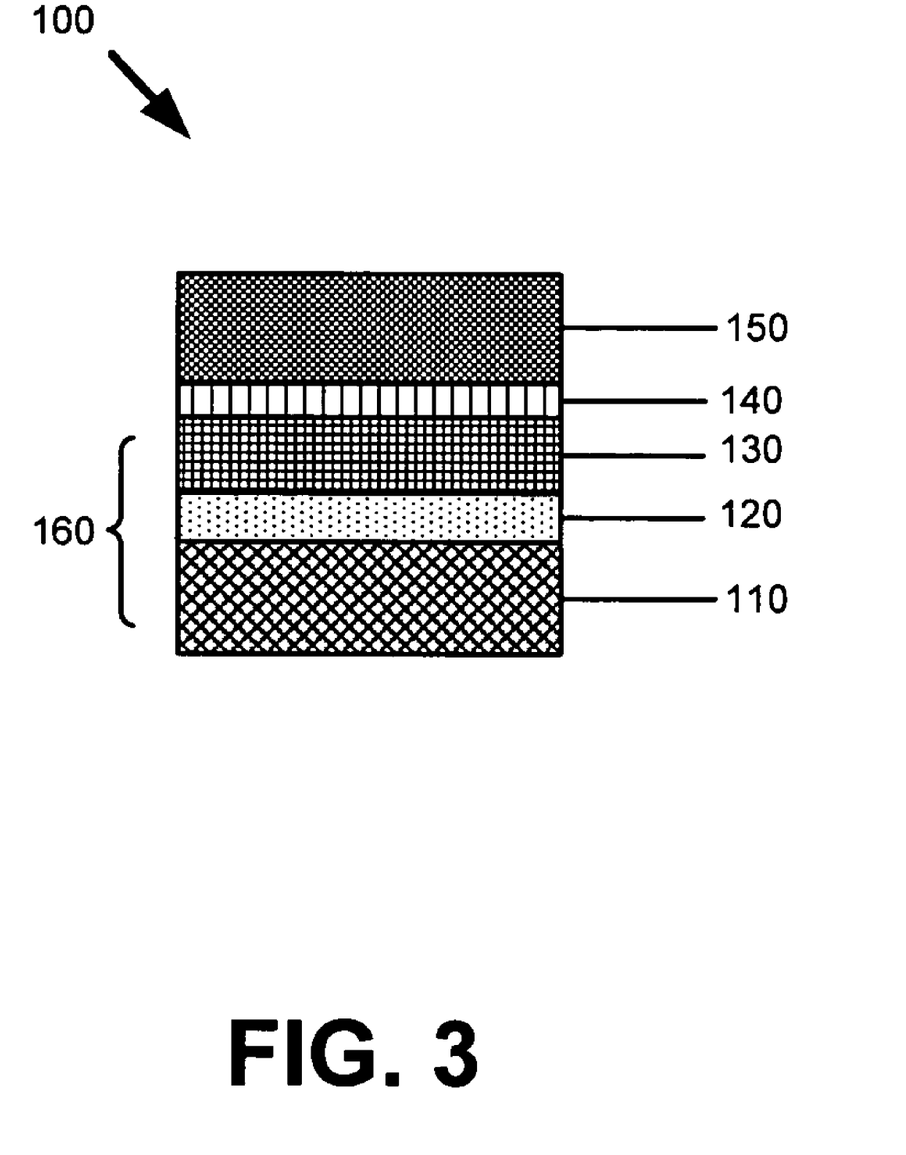
FIG. 3 illustrates an exemplary multi-layered magnetic memory structure.
Figure 5:
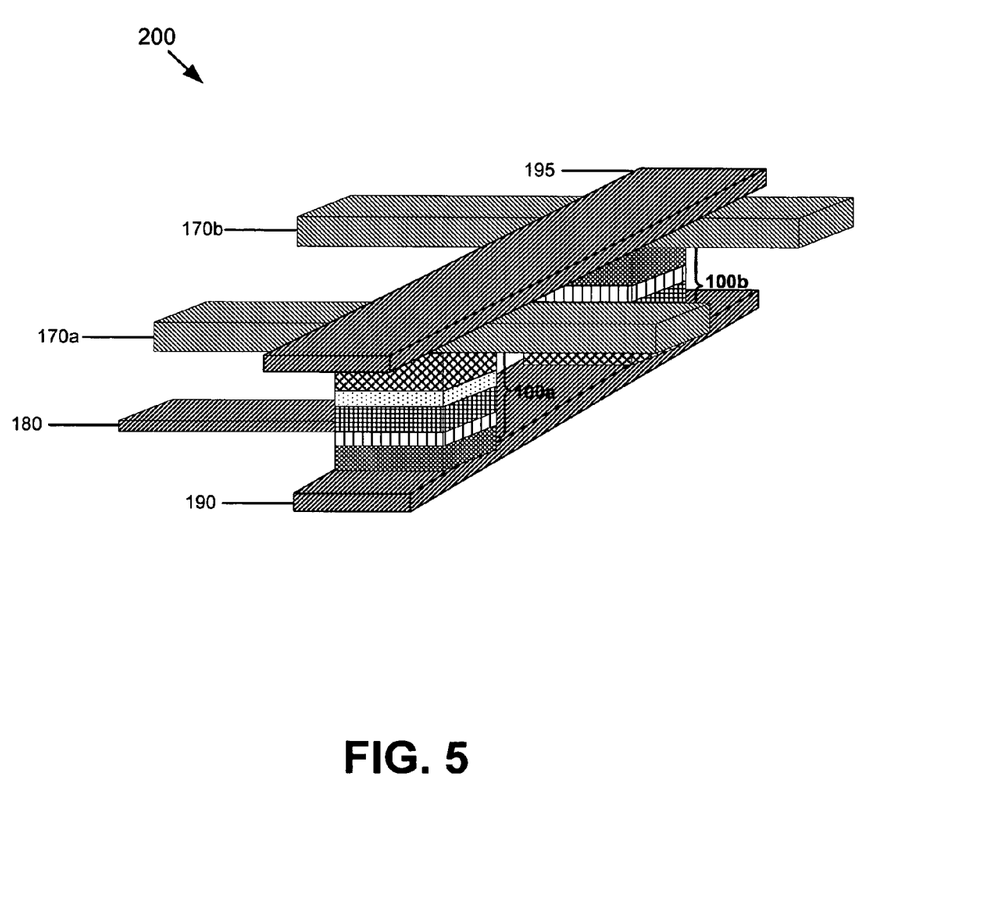
FIG. 5 illustrates an array of exemplary multi-layered magnetic memory structures of FIG. 3 and their nearby conducting lines.

Generally, a memory structure may be made as top-pinned (where the reference layer is on top of the data layer) or bottom-pinned (where the reference layer is below the data layer). For ease of explanation, only the top-pinned configuration is shown in FIG. 3. However, this configuration is merely illustrative. Thus, one skilled in the art will readily appreciate that other configurations (e.g., bottom-pinned, etc.) may also be implemented in accordance with any particular design requirement. For example, a bottom-pinned configuration of the memory cell of FIG. 3 is illustrated in FIG. 5.

In FIG. 3, the top-pinned memory structure 100 includes a first ferromagnetic layer 110, a non-magnetic insulating layer 120, a second ferromagnetic layer 130, a spacer layer 140, and a reference layer 150. For ease of explanation, the combination of the first ferromagnetic layer 110, the non-magnetic insulating layer 120, and the second ferromagnetic layer 130 may be referred to as a data layer 160, and the layers 110-150 may be referred to as a memory cell 100. Of course, the memory cell 100 may also be bottom-pinned (not shown), in which case the reference layer 150 is below the data layer 160. For clarity of illustration, additional structures and/or layers known in the art are not illustrated in FIG. 3. For example, multiple conductors (not shown) near the memory cell 100 can be used collectively for write and read operations. An exemplary memory array including nearby conductors will be described in more detail below with reference to FIG. 5.

Another magnetic memory structure configuration may also include a seed layer, a protective cap layer, an anti-ferromagnetic layer and/or other layers. The seed layer generally enhances crystalline alignment. Exemplary materials for a seed layer include Ta, Ru, NiFe, Cu, or combinations of these materials. The protective cap layer protects the data layer 160 from the environment (e.g., by reducing oxidation of the data layer 160) and may be formed using any suitable material known in the art, for example, Ta, TaN, Cr, Al or Ti. The anti-ferromagnetic layer enhances magnetic stability in the reference layer 150. Exemplary materials for an anti-ferromagnetic layer include IrMn, FeMn, NiMn, PtMn, and/or other well known materials. For ease of explanation, these additional layers are not shown in the Figures; however, magnetic memory structures having one or more of these (or other) additional layers may be implemented with various embodiments to be described herein in accordance with design choices.

The first and second ferromagnetic layers (110 & 130) may comprise one or more ferromagnetic materials. In an exemplary embodiment, ferromagnetic materials suitable for these layers include, without limitation, NiFe, NiFeCo, CoFe, other magnetic alloys of NiFe and Co, amorphous ferromagnetic alloys, and other materials.

In an exemplary implementation, the first ferromagnetic layer 110 has a higher magnetic coercivity than the second ferromagnetic layer 130. As a result, a higher magnetic field (in either the positive or negative direction) is required to switch the magnetic moment (or orientation) of the first ferromagnetic layer 110 than the amount required to switch the magnetic moment of the second ferromagnetic layer 130. A higher coercivity in a layer of ferromagnetic material can be achieved by adjusting the lateral aspect ratio, thickness, material, deposition conditions and/or other parameters of the layer in accordance with design choice. In an exemplary implementation described herein, the first ferromagnetic layer 110 is thicker than the second ferromagnetic layer 130 but has substantially the same lateral size and material as the second ferromagnetic layer 130. In this implementation, data can be stored in the first ferromagnetic layer 110 (having a relatively higher coercivity than the second ferromagnetic layer 130) by switching the magnetic moment of the first ferromagnetic layer 110 to a desired position during a write operation. An exemplary write operation will be described in more detail below with reference to FIG. 7.

The non-magnetic insulating layer 120 may comprise insulating materials including $SiO_2$, $SiN_x$, MgO, $Al_2O_3$, $AlN_x$, $TaO_x$, and/or other insulating materials. The non-magnetic insulating layer 120 effectively electrically separates the first ferromagnetic layer 110 from the rest of the memory cell (i.e., the second ferromagnetic layer 130, the spacer layer 140 and the reference layer 150). In this configuration, the chances of inadvertent corruption of the data stored in the first ferromagnetic layer 110 are substantially reduced. For example, during a read operation, a read current will not pass through the first ferromagnetic layer 110 but instead through the second ferromagnetic layer 130 and the reference layer 150. As a result, the read current is unlikely to corrupt the data stored in the first ferromagnetic layer 110. An exemplary read operation will be described in more detail in Section III below.

In an exemplary implementation, the thickness of the non-magnetic insulating layer 120 is determined based on a desired demagnetizing coupling effect between the first ferromagnetic layer 110 and the second ferromagnetic layer 130. In general, as the non-magnetic insulating layer 120 becomes thinner, a stronger demagnetizing coupling between the two ferromagnetic layers (110 & 130) results. As the edges of the ferromagnetic layers (110 & 130) become closer to each other, the effects of the demagnetizing fields emanating from the edges become stronger. The demagnetizing fields emanating from each ferromagnetic layer can improve or undermine the stability of the magnetic orientations of nearby ferromagnetic layers. For example, if the magnetic moments of two nearby ferromagnetic layers are antiparallel, then the demagnetizing fields from each of the two layers can improve the stability of the magnetic orientation of the other layer. However, if the magnetic moments of two nearby ferromagnetic layers are parallel, then the demagnetizing fields from each of the two layers can undermine the stability of the other layer, or even cause an unintended switching of the magnetic orientation of a nearby layer.

In an exemplary implementation, the magnetic moment of the second ferromagnetic layer 130 is oriented by the demagnetization fields from the first ferromagnetic layer 110 to be in antiparallel position relative to the magnetic moment of the first ferromagnetic layer 110. As a result, the demagnetizing fields from the second ferromagnetic layer 130 improve the stability of the data written into the first ferromagnetic layer 110 (rather than corrupting the data). However, if the demagnetizing fields from the second ferromagnetic layer 130 become too strong (e.g., by being too close to the first ferromagnetic layer 110), they may cause the magnetic moment of the first ferromagnetic layer 110 to become so stable that a higher write current may be required to write into the first ferromagnetic layer 110. Depending on these and other design considerations, the non-magnetic insulating layer 120 can have a thickness of, for example, between 0.5 nm to 100 nm, depending on design choice.

In an exemplary embodiment, the spacer layer 140 is a tunnel barrier layer (e.g., if the memory cell 100 is a TMR memory cell). In this embodiment, the spacer layer 140 may be made of $SiO_2$, $SiN_x$, MgO, $Al_2O_3$, $AlN_x$, $TaO_x$, and/or other insulating materials. The thickness of tunnel barrier layer may range from approximately 0.5 nanometers to 3 nanometers.

In another exemplary embodiment, the spacer layer 140 is a non-magnetic conducting layer (e.g., if the memory cell 100 is a GMR memory cell). In this embodiment, the spacer layer 140 may be made of Cu, Au, Ag, and/or other non-magnetic conducting materials.

The reference layer 150 may comprise one or more ferromagnetic materials. In an exemplary embodiment, ferromagnetic materials suitable for the reference layer 150 include NiFe, NiFeCo, CoFe, other magnetic alloys of NiFe and Co, amorphous ferromagnetic alloys, and other materials. The first and second ferromagnetic layers (110 & 130) and the reference layer 150 may be made of the same or different materials. The reference layer 150 may be a pinned reference layer or a soft reference layer. In the former implementation, the magnetic orientation of the reference layer 150 is pinned to a known direction by, for example, an anti-ferromagnetic layer. In the latter implementation, the magnetic orientation of the reference layer 150 may be dynamically pinned prior to a read operation by a providing a current in a predetermined direction. In either implementation, during a read operation, the magnetic orientation of the reference layer 150 is known and may serve as a reference for determining the magnetic orientation of the data layer (e.g., the first ferromagnetic layer 110).

A data layer 160 comprising two ferromagnetic layers (110 & 130) separated by a non-magnetic insulating layer 120 can be desirable because the combined magnetic volume of the two ferromagnetic layers (110 & 130) improves the thermal stability of the memory cell 100. Yet at the same time, because the two ferromagnetic layers (110 & 130) are coupled by demagnetizing fields, their combined coercivity can be reduced. For example, if the first ferromagnetic layer 110 is 4 nm thick and the second ferromagnetic layer 130 is 3 nm thick, the combined coercivity of the data layer 160 can be equal to a ferromagnetic data layer that is 1 nm thick (when the magnetic moments of the layers are antiparallel as a result of, for example, the demagnetization coupling). This is because the magnetic moments, when antiparallel, in the first ferromagnetic layer 110 and the second ferromagnetic layer 130 can cancel each other. As a result, data stored in the data layer 160 can be more easily switched by applying a write current sufficient to switch the magnetic moment of a 1 nm thick ferromagnetic layer (as opposed to a current sufficient to switch a 3 nm or 4 nm thick ferromagnetic layer). This result can be illustrated with reference to FIG. 4. The example provided above is merely illustrative. A person skilled in the art will recognize that the magnetic volume (e.g., lateral width, thickness, shape, etc.) of each layer can be adjusted in accordance with design choice.

Figure 4:
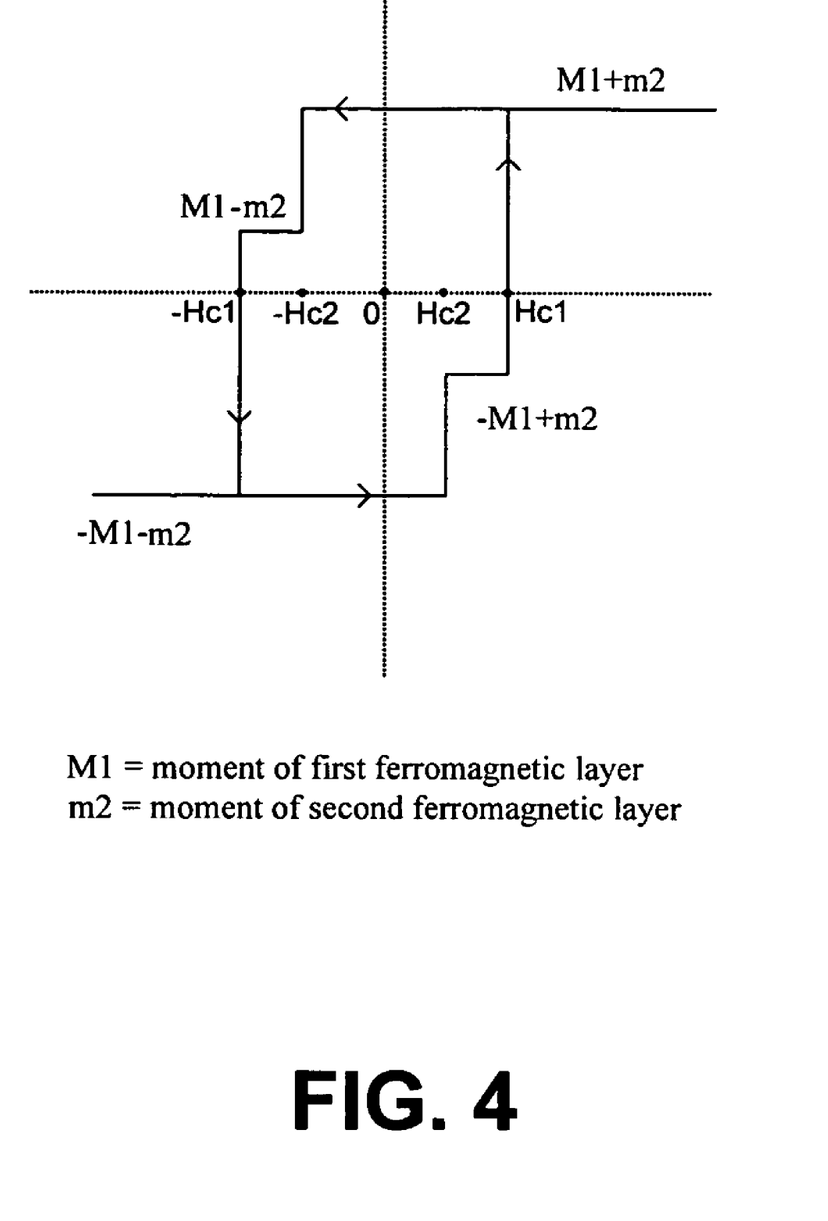
FIG. 4 illustrates an exemplary Hysteresis loop of the combined total magnetic moments of first and second ferromagnetic layers separated by a non-magnetic insulating layer at various applied magnetic fields.

FIG. 4 illustrates an exemplary combined Hysteresis loop of the magnetic moments of the first ferromagnetic layer 110 and the second ferromagnetic layer 130. M1 represents the magnetic moment of the first ferromagnetic layer 110 which can be switched from one direction to an opposite direction by applying a magnetic field greater than Hc1 in the positive or negative direction. In FIG. 4, m2 represents the magnetic moment of the second ferromagnetic layer 130 which can be switched from one direction to an opposite direction by applying a magnetic field greater than Hc2 in the positive or negative direction. In this example, the first ferromagnetic layer 110 has a higher coercivity (e.g., by being relatively thicker) than the second ferromagnetic layer 130. Thus, Hc1 (or coercivity of the first ferromagnetic layer 110) is greater than Hc2 (coercivity of the second ferromagnetic layer 130). The total magnetic moments of the first and second ferromagnetic layers (110 & 130) coupled by demagnetizing fields are equal to the sum of the magnetic moments of the two layers at any given applied magnetic field. For example, if the magnetic moments of both the first and second ferromagnetic layers (110 & 130) are initially parallel and positive (e.g., after an initial application of a magnetic field that exceeds Hc1 in the positive direction), then the total magnetic moment (M) is equal to M1+m2 (see the upper right hand corner of FIG. 4). In the negative loop in FIG. 4, the total magnetic moment M remains at M1+m2 until a magnetic field that exceeds Hc2 in the negative direction is applied. When the applied magnetic field is between Hc2 and Hc1 in the negative direction, the total magnetic moment M is equal to M1−m2. When the applied magnetic field exceeds Hc1 in the negative direction, the total magnetic moment M is equal to −M1−m2. If the direction of the magnetic fields is switched back to a positive direction, the total magnetic moment M will remain equal to −M1−m2 until the applied magnetic field exceeds Hc2 in the positive direction. When the applied magnetic field is between Hc2 and Hc1 in the positive direction, the total magnetic moment M is equal to −M1+m2. When the applied magnetic field exceeds Hc1 in the positive direction, the total magnetic moment M is equal to M1+m2. Thus, when the magnetic moments of the first and second ferromagnetic layers (110 & 130) are antiparallel to each other, the total magnetic moment M is equal to either M1−m2 or −M1+m2. In each instance, the total magnetic moment M is less than M1 alone. As a result, the total coercivity of the data layer 160 is reduced.

FIG. 5 illustrates an exemplary memory array 200. The memory array 200 includes multiple memory cells (100a, 100b, etc.), and their nearby conducting leads (170a-170b, 180, 190, 195) for addressing the memory cells during read and write operations. As explained above, a memory cell may be top-pinned or bottom-pinned. For ease of explanation, the memory cells 100a and 100b are bottom-pinned (as opposed to the exemplary memory cell 100 of FIG. 3, which is top-pinned).

Memory cell 100a is located at the intersection of a word line 170a and a bit line 195 that are orthogonally arranged with respect to each other. During a write operation, memory cell 100a can be selected for writing data by applying write currents in both the word line 170a and the bit line 195 that in combination generate a magnetic field exceeding the coercivity of the data storage layer (e.g., the first ferromagnetic layer 110 in the memory 100 of FIG. 3) to switch its magnetic orientation from a positive to a negative direction or vice versa.

In addition, memory cell 100a is connected to a read line 180. During a read operation, a read current is applied in the read line 180 and a relative resistance between the second ferromagnetic layer 130 and the reference layer 150 can be sensed by sensing the current outputting through the bit line 190 to a sensing device (not shown). Thus, the read current has a reduced influence on the magnetic moment of the data storage layer (i.e., the first ferromagnetic layer 110) because the read current does not pass through it.

Peripheral circuitry (e.g., sensing device, etc.) for reading from and writing into the memory array 200 are well known in the art and need not be described in more detail herein.

Exemplary read and write operations will now be described in more detail below.

III. An Exemplary Read Operation

Figure 6:
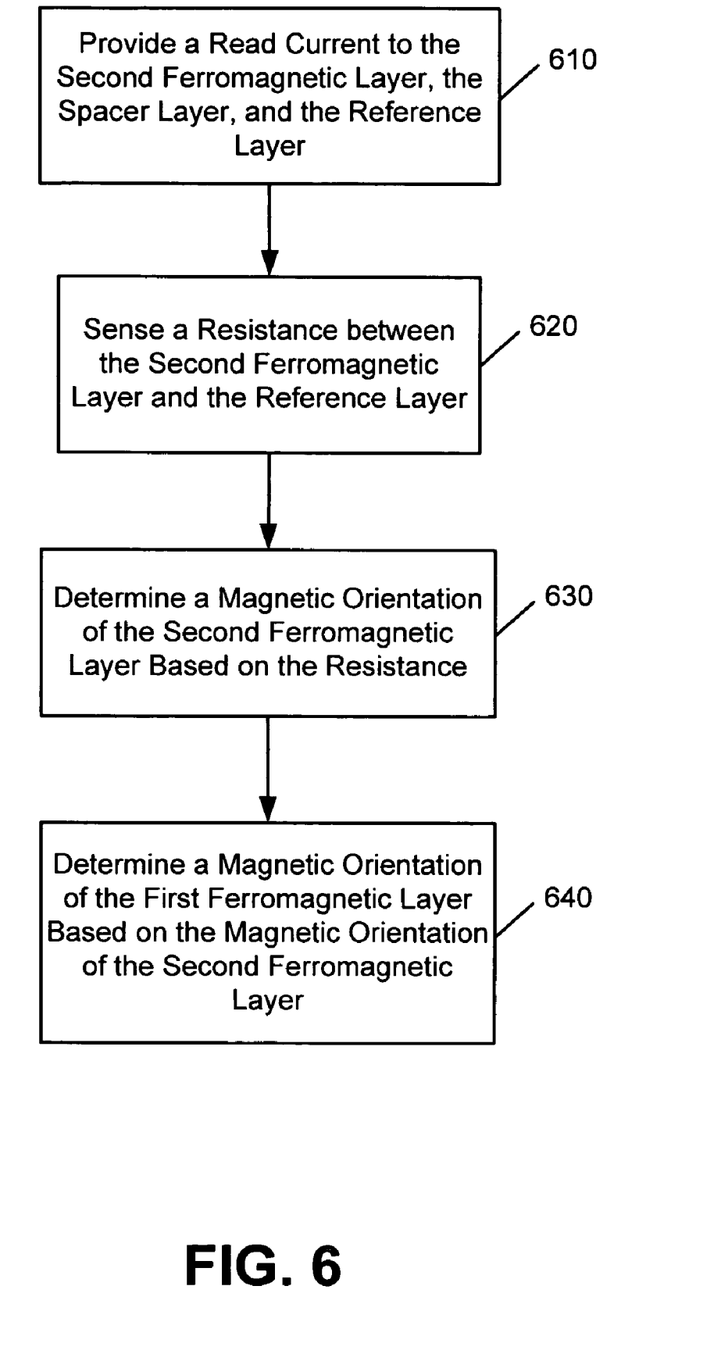
FIG. 6 illustrates an exemplary flow chart of an exemplary read operation.

FIG. 6 illustrates an exemplary read operation with reference to the exemplary memory structure illustrated in FIG. 3.

At step 610, a read current is applied to the second ferromagnetic layer 130, the spacer layer 140, and the reference layer 150.

At step 620, a resistance between the second ferromagnetic layer 130 and the reference layer 150 is sensed by a sensing device.

At step 630, a magnetic orientation of the second ferromagnetic layer 130 is determined based on the sensed resistance. The magnetic orientation of the reference layer 150 is known (e.g., previously pinned to a known orientation by an AFM layer or pinned by another current prior to the read operation). Thus, if the resistance between the second ferromagnetic layer 130 and the reference layer 150 is relatively high, then the magnetic orientation of the second ferromagnetic layer 130 is antiparallel to the magnetic orientation of the reference layer 150. If the resistance between the second ferromagnetic layer 130 and the reference layer 150 is relatively low, then the magnetic orientation of the second ferromagnetic layer 130 is parallel to the magnetic orientation of the reference layer 150.

At step 640, a magnetic orientation of the first ferromagnetic layer 110 is determined based on the magnetic orientation of the second ferromagnetic layer 130. The magnetic orientations of the first ferromagnetic layer 110 and the second ferromagnetic layer 130 are antiparallel to each other because their magnetic moments are coupled by the demagnetizing fields emanating from their edges. Thus, if one knows the magnetic orientation of the second ferromagnetic layer 130, one can determine the magnetic orientation of the first ferromagnetic layer 110 (i.e., antiparallel to the direction of the second ferromagnetic layer 130).

Data is read from the first ferromagnetic layer 110 without running a current through the first ferromagnetic layer 110. As a result, chances of corrupting the data stored in the first ferromagnetic layer 110 are reduced.

IV. An Exemplary Write Operation

Figure 7:
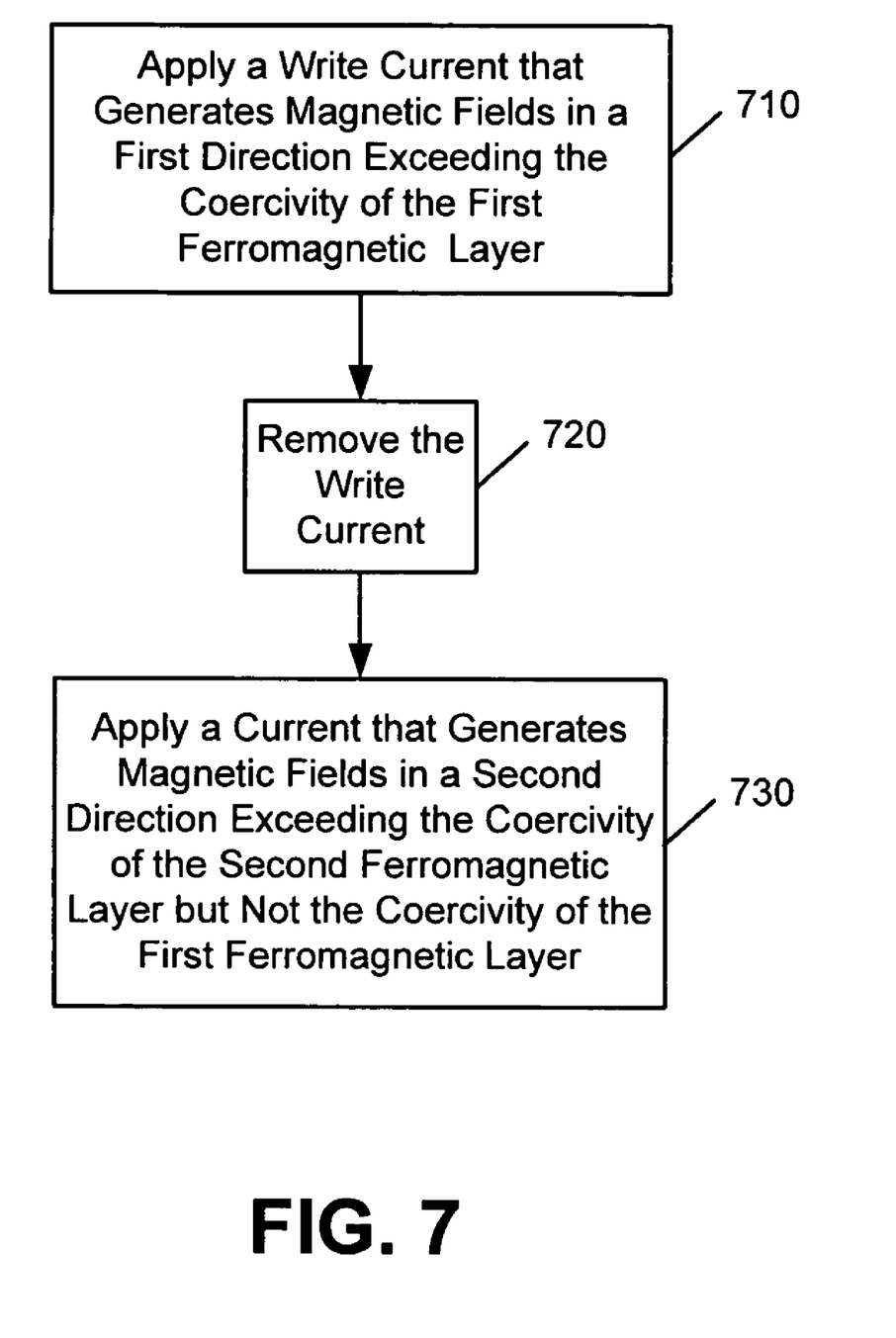
FIG. 7 illustrates an exemplary flow chart of an exemplary write operation.

In an exemplary write operation, the first ferromagnetic layer 110 has a magnetic moment in the negative direction, the second ferromagnetic layer 130 has a magnetic moment in the positive direction, and the reference layer 150 has a magnetic moment pinned to a positive direction. FIG. 7 illustrates an exemplary flow chart of the exemplary write operation.

At step 710, a write current able to generate a magnetic field in a first direction (e.g., the positive direction) exceeding the coercivity of the first ferromagnetic layer 110 is applied. This magnetic field, for example, can effectively switch the magnetic moment of the first ferromagnetic layer 110 from a negative direction to a positive direction. Because the second ferromagnetic layer 130 has a lower coercivity than the first ferromagnetic layer 110, the magnetic moment of the second ferromagnetic layer 130 is also switched to a positive direction. In practice, when taking into account the demagnetizing fields emanating from the edges of the second ferromagnetic layer 130 (whose magnetic moment is antiparallel to the first ferromagnetic layer 110), the actual write current needed to switch the magnetic moment of the first ferromagnetic layer 110 may be reduced (see FIG. 4). However for ease of explanation, the write operation will be explained with reference to the coercivity of each ferromagnetic layer.

Next, at step 720, the write current is removed. In an exemplary implementation, the write current is no longer being applied so the magnetic field in the first direction generated by the write current is also removed. Depending on the strength of the demagnetizing coupling between the first and second ferromagnetic layers (110 & 130), the magnetic moment of the second ferromagnetic layer 130 may be switched to a negative direction by the demagnetizing fields emanating from the edges of the first ferromagnetic layer 110. As a result, the magnetic moments of the first and second ferromagnetic layers (110 & 130) are again antiparallel to each other. However, for increased device robustness, step 730 can be applied. At step 730, a current able to generate a magnetic field in a second direction (e.g., the negative direction) exceeding the coercivity of the second ferromagnetic layer 130 but not the coercivity of the first ferromagnetic layer 110 is applied to switch the magnetic moment of the second ferromagnetic layer 130 to a negative direction (without switching the magnetic moment of the first ferromagnetic layer 110). As a result, in the final state of the write operation, the magnetic moments of the first and second ferromagnetic layers (110 & 130) are again antiparallel to each other.

Figure 8:
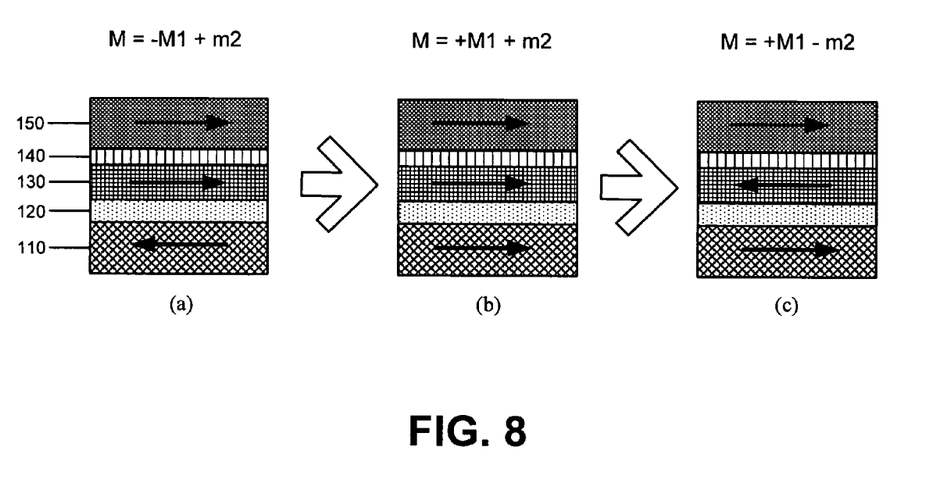
FIG. 8 illustrates an exemplary representation of the exemplary write operation of FIG. 7.

FIG. 8 illustrates an exemplary representation of the exemplary write operation described above. In part (a) of FIG. 8, the memory cell 100 is in a first state before the write operation. In part (b) of FIG. 8, the memory cell 100 is in a second state after the application of the write current as described in step 710. In part (c) of FIG. 8, the memory cell 100 is in a third state either at the end of step 720 or step 730, or both.

Figure 9:
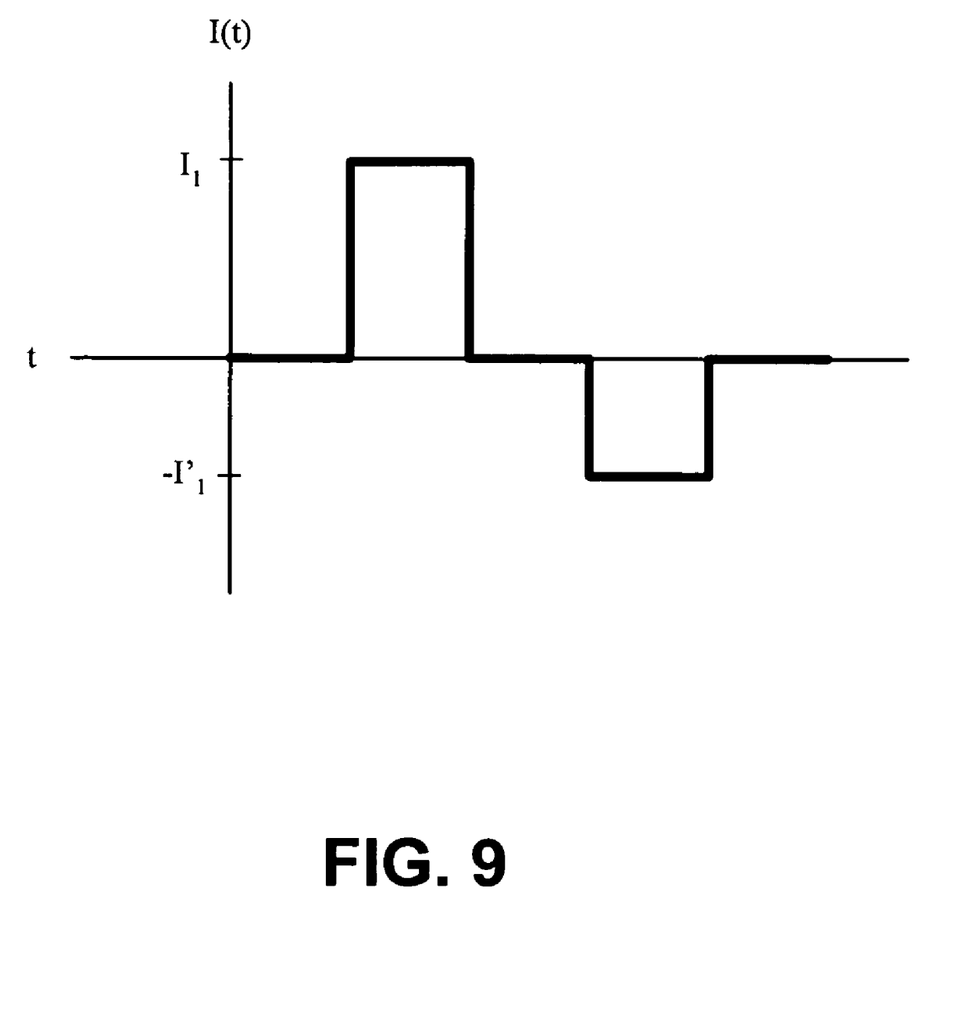
FIG. 9 illustrates an exemplary representation of write currents during an exemplary write operation.

FIG. 9 illustrates an exemplary representation of the write currents being applied in the exemplary sequence described above. In this exemplary representation, the current $I_1$ represents a current able to generate a magnetic field in a positive direction exceeding the coercivity of the first ferromagnetic layer. The current $-I'_1$ represents a current able to generate a magnetic field in a negative direction exceeding the coercivity of the second ferromagnetic layer 130 but not the coercivity of the first ferromagnetic layer 110. The exemplary write operations described above are merely illustrative. A person skilled in the art will recognize that other processes (e.g., different current sequences) may be implemented in accordance with design choice.

Figure 10:
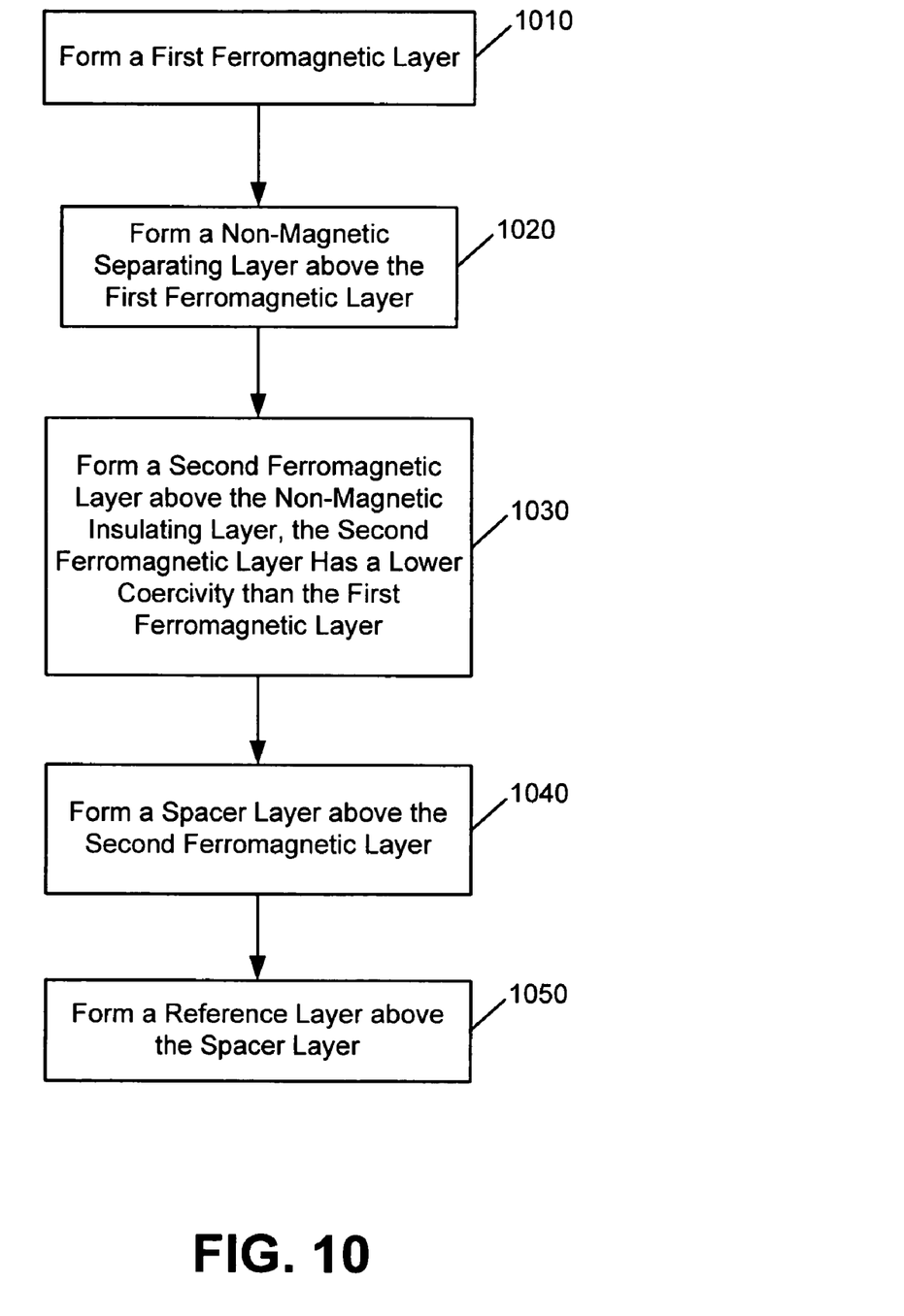
FIG. 10 illustrates an exemplary process for manufacturing the exemplary multi-layered magnetic memory structure of FIG. 3.

V. An Exemplary Process for Manufacturing a Multi-Layered Magnetic Memory Structure FIG. 10 illustrates an exemplary process for making the exemplary magnetic memory structure of FIG. 3.

At step 1010, a first ferromagnetic layer 110 is formed by deposition or other techniques known in the art (e.g., via sputtering, evaporation, chemical vapor deposition, atomic layer deposition (ALD), and/or other known techniques). In an exemplary implementation, the first ferromagnetic layer 110 can be formed above a seed layer (not shown) to enhance crystalline alignment using techniques known in the art.

At step 1020, a non-magnetic insulating layer 120 is formed by deposition or other techniques known in the art.

At step 1030, a second ferromagnetic layer 130 is formed by deposition or other techniques known in the art. The second ferromagnetic layer 130 has a lower coercivity than the first ferromagnetic layer 110.

At step 1040, a spacer layer 140 is formed above the second ferromagnetic layer by deposition or other techniques known in the art.

At step 1050, a reference layer 150 is formed by deposition or other techniques known in the art.

The layers formed one above the other are, in due course, patterned and etched into multiple patterned layers for forming multiple memory cells. These patterning and etching steps are well known in the art and need not be described herein.

The manufacturing steps illustrated above are merely exemplary. Those skilled in the art will appreciate that other manufacturing steps may be used in accordance with the requirements of a particular implementation. For example, the various layers as illustrated in FIG. 3 may be formed in accordance with other manufacturing sequences (e.g., the reference layer 150 may be formed first in a bottom-pinned memory structure), one or more layers may be formed at the same time, one or more layers of different materials may be combined to form a single layer, etc.

Further, the TMR memory cell illustrated above is merely exemplary. Those skilled in the art will appreciate that other types of memory cells (e.g., GMR memory cells, etc.) may be constructed according to the requirements of a particular implementation. For example, the spacer layer 140 may be a non-magnetic conducting layer for constructing a GMR memory cell.

VI. Conclusion

The foregoing examples illustrate certain exemplary embodiments from which other embodiments, variations, and modifications will be apparent to those skilled in the art. The inventions should therefore not be limited to the particular embodiments discussed above, but rather are defined by the claims. Furthermore, some of the claims may include alpha-numeric identifiers to distinguish the elements and/or recite elements in a particular sequence. Such identifiers or sequence are merely provided for convenience in reading, and should not necessarily be construed as requiring or implying a particular order of steps, or a particular sequential relationship among the claim elements.

What is claimed is:

1. A memory array including a plurality of memory cells, each of said memory cells comprising:
   a first ferromagnetic layer;
   a second ferromagnetic layer spaced apart from said first ferromagnetic layer by a non-magnetic insulating layer and being magnetically coupled to said first ferromagnetic layer by demagnetizing fields from said first ferromagnetic layer;
   a non-ferromagnetic spacer layer above said second ferromagnetic layer; and
   a ferromagnetic reference layer above said spacer layer;
   wherein said first ferromagnetic layer, said non-magnetic insulating layer and said second ferromagnetic layer in combination function as a dual-ferromagnetic data layer of said memory cell.

2. The memory array of claim 1, wherein the magnetic moments of said first ferromagnetic layer and said second ferromagnetic layer are antiparallel.

3. The memory array of claim 1, wherein said first ferromagnetic layer and said second ferromagnetic layer comprise the same material.

4. A memory array including a plurality of memory cells, each of said memory cells comprising:
   a first ferromagnetic layer;
   a second ferromagnetic layer spaced apart from said first ferromagnetic layer by a non-magnetic insulating layer and being magnetically coupled to said first ferromagnetic layer by demagnetizing fields from said first ferromagnetic layer, said second ferromagnetic layer having a lower coercivity relative to said first ferromagnetic layer;

a spacer layer above said second ferromagnetic layer; and
a ferromagnetic reference layer above said spacer layer;
wherein said first ferromagnetic layer, said non-magnetic insulating layer and said second ferromagnetic layer in combination function as a dual-ferromagnetic data layer of said memory cell.

5. A method for reading a multi-layered magnetic memory structure having a first ferromagnetic layer and a second ferromagnetic layer separated by a non-magnetic insulating layer, said layers in combination form a data layer of said structure, comprising:
providing a read current to said second ferromagnetic layer, a spacer layer, and a ferromagnetic reference layer;
sensing a resistance between said second ferromagnetic layer and said ferromagnetic reference layer;
determining a magnetic orientation of said second ferromagnetic layer based on said resistance; and
determining a magnetic orientation of said first ferromagnetic layer, which did not receive the read current, based on said magnetic orientation of said second ferromagnetic layer.

6. A method for reading a multi-layered magnetic memory structure having a first ferromagnetic layer and a second ferromagnetic layer separated by a non-magnetic insulating layer, said layers in combination forming a data layer of said structure and said first ferromagnetic layer having a higher coercivity relative to said second ferromagnetic layer, comprising:
providing a read current to said second ferromagnetic layer, a spacer layer, and a reference layer;
sensing a resistance between said second ferromagnetic layer and said reference layer;
determining a magnetic orientation of said second ferromagnetic layer based on said resistance; and
determining a magnetic orientation of said first ferromagnetic layer based on said magnetic orientation of said second ferromagnetic layer.

7. A method for reading a multi-layered magnetic memory structure having a first ferromagnetic layer and a second ferromagnetic layer separated by a non-magnetic insulating layer, said layers in combination forming a data layer of said structure, comprising:
providing a read current to said second ferromagnetic layer, a spacer layer, and a reference layer;
sensing a resistance between said second ferromagnetic layer and said reference layer;
determining a magnetic orientation of said second ferromagnetic layer based on said resistance; and
determining a magnetic orientation of said first ferromagnetic layer based on said magnetic orientation of said second ferromagnetic layer;
wherein said first ferromagnetic layer and said second ferromagnetic layer are coupled by demagnetizing fields.

8. A method for reading a multi-layered magnetic memory structure having a first ferromagnetic layer and a second ferromagnetic layer separated by a non-magnetic insulating layer, said layers in combination forming a data layer of said structure, comprising:
providing a read current to said second ferromagnetic layer, a spacer layer, and a reference layer;
sensing a resistance between said second ferromagnetic layer and said reference layer;
determining a magnetic orientation of said second ferromagnetic layer based on said resistance; and
determining a magnetic orientation of said first ferromagnetic layer based on said magnetic orientation of said second ferromagnetic layer;
wherein the magnetic moments of said first ferromagnetic layer and said second ferromagnetic layer are antiparallel prior to application of said method.

9. A method for writing data into a multi-layered magnetic memory structure, comprising:
providing a first magnetic field to reverse a magnetic moment of a first ferromagnetic layer, the first ferromagnetic layer:
being separated from a second ferromagnetic layer by a non-magnetic insulating layer; and
having a first coercivity higher than a second coercivity of said second ferromagnetic layer; and
providing a second magnetic field less than said first magnetic field to reverse a magnetic moment of said second ferromagnetic layer without reversing the magnetic moment of said first ferromagnetic layer.

10. The method of claim 9, wherein said first ferromagnetic layer and said second ferromagnetic layer are coupled by demagnetizing fields.

11. The method of claim 9, wherein the magnetic moments of said first ferromagnetic layer and said second ferromagnetic layer are antiparallel prior to application of said method.

12. The method of claim 9, wherein the magnetic moments of said first ferromagnetic layer and said second ferromagnetic layer are antiparallel after application of said method.

13. An integrated circuit device, comprising:
a memory array having a plurality of magnetic memory cells therein that respectively comprise:
a dual-ferromagnetic data layer having a non-magnetic insulating layer therein that separates first and second ferromagnetic layers having unequal coercivities from each other;
a non-ferromagnetic spacer layer on the dual-ferromagnetic data layer; and
a ferromagnetic reference layer on the spacer layer.

14. The device of claim 13, wherein the plurality of magnetic memory cells are TMR memory cells and the spacer layer comprises an electrically insulating material.

15. The device of claim 13, wherein the plurality of magnetic memory cells are GMR memory cells and the spacer layer comprises a non-magnetic electrically conductive material.

16. The device of claim 13, wherein a coercivity of the first ferromagnetic layer is greater than a coercivity of the second ferromagnetic layer.

17. A method of operating the device of claim 13, comprising:
writing data to a first one of the plurality of magnetic memory cells by:
switching a magnetic orientation of a first ferromagnetic layer in the first magnetic memory cell by generating a first magnetic field therein that exceeds a coercivity of the first ferromagnetic layer; and
switching a magnetic orientation of a second ferromagnetic layer in the first magnetic memory cell by generating a second magnetic field therein that exceeds a coercivity of the second ferromagnetic layer but not the coercivity of the first ferromagnetic layer.

18. The method of claim 17, further comprising:
reading data from the first one of the plurality of magnetic memory cells by:
passing a read current through the second ferromagnetic layer and corresponding ferromagnetic reference layer, but not the first ferromagnetic layer, to thereby determine the magnetic orientation of the second ferromagnetic layer.

19. The method of claim 18, wherein the data read from the first one of the plurality of magnetic memory cells is based on the magnetic orientation of the first ferromagnetic layer, which is opposite the determined magnetic orientation of the second ferromagnetic layer.

* * * * *